United States Patent [19]
Howatt

[11] Patent Number: 5,077,539
[45] Date of Patent: Dec. 31, 1991

[54] SWITCHING AMPLIFIER
[75] Inventor: John R. Howatt, Bedford, Mass.
[73] Assignee: Apogee Technology, Inc., Randolph, Mass.
[21] Appl. No.: 633,762
[22] Filed: Dec. 26, 1990
[51] Int. Cl.[5] .............................................. H03F 3/393
[52] U.S. Cl. ..................................... 330/10; 330/251; 363/17; 323/283
[58] Field of Search ...................... 330/10, 251, 207 A; 323/283; 363/26; 275/22; 332/108, 109, 111

[56] References Cited
U.S. PATENT DOCUMENTS

| | | | |
|---|---|---|---|
| 4,240,036 | 12/1980 | Kohler | 330/10 |
| 4,249,136 | 2/1981 | Suzuki et al. | 330/251 |
| 4,318,053 | 3/1982 | Sondermeyer | 330/281 |
| 4,484,145 | 11/1984 | Haulin | 330/10 |
| 4,600,891 | 7/1986 | Taylor, Jr. et al. | 330/10 |
| 4,953,068 | 8/1990 | Henze | 363/17 |
| 5,014,016 | 5/1991 | Anderson | 330/10 |

Primary Examiner—Eugene R. LaRoche
Assistant Examiner—Tan Dinh
Attorney, Agent, or Firm—Robert F. O'Connell

[57] ABSTRACT

A switching amplifier system which in one embodiment includes switching circuitry responsive to a tri-state command signal for providing a power output from a power supply which has amplitude levels, time durations, and polarities corresponding to the tri-state command signal for supply to a load via a suitable filter. A further embodiment includes a linear amplifier, the switching circuitry responding to a fourth state command signal for actuating the linear amplifier to respond directly to an input signal when the amplitude of the input signal is below a selected level.

17 Claims, 5 Drawing Sheets

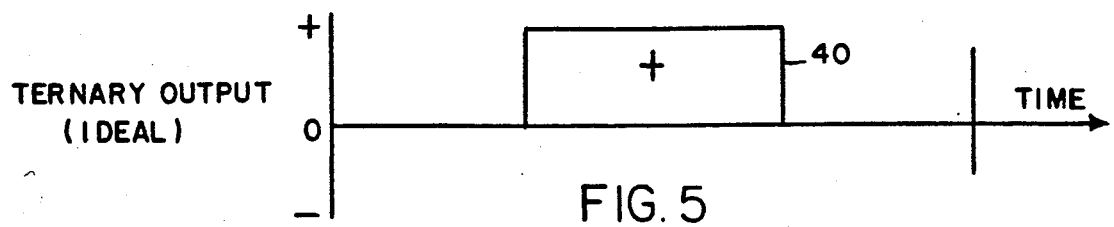
FIG. 5
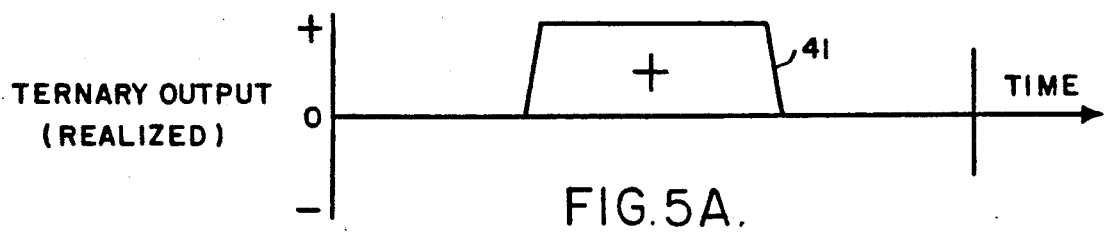
FIG. 5A.
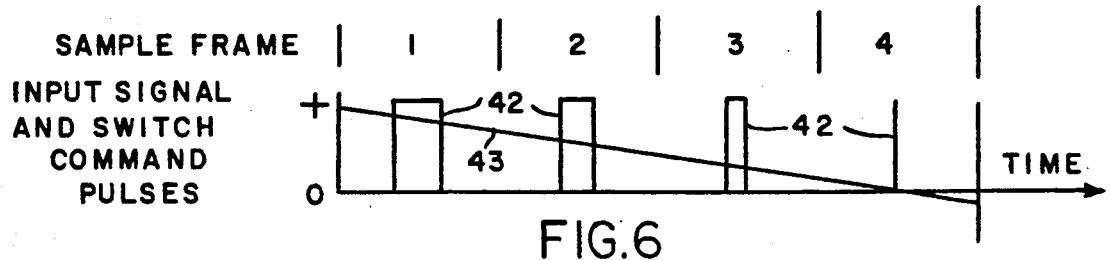
FIG. 6
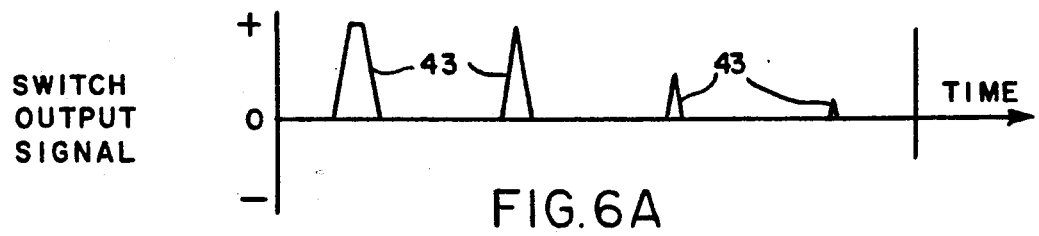
FIG. 6A
| OUTPUT | SWITCH STATE | | | | AMP | |
|---|---|---|---|---|---|---|
| | 26A | 26B | 26C | 26D | 54 | 55 |
| PLUS | ON | OFF | OFF | ON | OFF | OFF |
| ZERO | ON | ON | OFF | OFF | OFF | OFF |
| (OR) | OFF | OFF | ON | ON | OFF | OFF |
| MINUS | OFF | ON | ON | OFF | OFF | OFF |
| ANALOG | OFF | OFF | OFF | OFF | ON | ON |
FIG. 8

SWITCHING AMPLIFIER

INTRODUCTION

This invention relates generally to power switching amplifiers and, more particularly, to improved switching amplifiers which use multiple state power output circuitry, preferably either ternary, i.e., tri-state, or quaternary, i.e., quadri-state, power output circuits.

BACKGROUND OF THE INVENTION

Analog amplifiers suffer from several disadvantages which have given rise to the development of switching, or discrete state, amplifiers. For a given power output, especially at relatively high amplitude levels, analog amplifiers suffer from poor efficiency, primarily because of the need to bias the active elements into linear regions for amplification without distortion, as in well-known Class A and Class B analog amplifiers. Since the power dissipated in the active elements is substantial, the resulting amplifier power efficiency is poor.

Moreover, the low efficiency of analog amplifiers increases the heat generated therein and results in size and weight penalties caused by the need to remove the heat generated. At relatively high power levels, for example, the amplifiers may require a large passive mechanical heat exchanger and/or the use of forced air heat exchangers for heat removal purposes.

Low efficiency also implies the need for larger power supplies for a given power output which further aggravates the efficiency problem because of the heat losses in the power supplies themselves, thereby imposing in effect a double penalty. Lower efficiency also increases costs because the power handling elements are larger, components having wider temperature ranges of operation are required, and heat removal techniques require added cooling components.

Further, analog amplifiers have an additional disadvantage when the input signal thereto is taken from a digital source, such as a CD player, or is some other serially digitized format signal. In such cases, an analog amplifier is not fundamentally compatible with serial digital inputs and requires intermediate conversion where the digital signal is first converted to an analog signal either at the source or in the amplifier, such conversion giving rise to added complexity and cost to the amplifier, and often resulting in a degradation of the signal quality.

Binary switching amplifiers have been used by those in the art to achieve higher efficiency than analog amplifiers by the substitution of a switching control operation for the linear control element in the output circuitry of the amplifier. Instead of a linearly biased element, one or more switches are alternated between on and off states in response to a digital command that is time modulated by the amplifier's input analog signal. The time modulated output signal is then filtered to yield an output signal that is an amplified replica of the input signal. Because the active control element comprises one or more switches which are either in an on or an off state, the power loss in the active element can be made relatively low as compared with analog amplifiers.

The low power losses allow substantial benefits in terms of the size and cost of the amplifier as well as in a reduced size and cost of the associated power supplies. Cooling can in most cases be handled by simple thermally conductive paths to the amplifier package itself, additional cooling components often not being required.

The fact that the output circuitry is digitally controlled means that a straightforward interface to digital signal sources is possible. All the processing required to create the time modulated signals can be done at the digital level. For serial data inputs this can be relatively simple and can take advantage of many of the new digital signal processing techniques.

While the use of currently available binary switching amplifiers provide the above discussed advantages over the use of analog amplifiers, it is desirable to improve even further the benefits derived from the use of switching techniques. For example, in such binary switching amplifiers, power dissipation at the output thereof is essentially constant since one or the other of the switching states is always being used. If that power dissipation can be reduced, the overall power efficiency of the amplifier can be increased.

Further, for most applications, e.g., in amplifying music, the average input signal and the resulting desired average output power are small compared to the peak power requirements. The constant power dissipation at the amplifier output, however, is related only to the peak power capacity. Thus, a low signal application must always suffer the power losses associated with the maximum output capabilities.

Similar losses also appear in the amplifier's output filter, which is required in all modulated systems in order to remove the carrier from the switched output. In a binary amplifier, the carrier frequency is the same as the sampling and conversion rate frequency. Since the output switch circuitry is always connected to a power supply which is providing power of one polarity or the other into the load, current is always flowing through the filter elements even if the net output polarity is zero. Since realizable filter elements are not purely reactive, power is dissipated therein, especially in inductive elements, and the power losses in the filter may be as high as those in the switch circuitry itself.

Another problem in using a binary switching amplifier implementation involves the removal of the modulation carrier frequency by the output filter. Because only two output states of opposite polarity are available, small outputs can only be created by cancellation of two large signals of opposite polarity. For a net output of zero, for example, the actual switched output spends equal times in the two opposite states. Such a large square wave signal, when filtered, results in a zero output with some superimposed ripple. Thus, for the creation of a very small output, a very large signal must be supressed by the filter in order to keep the resulting ripple from entering the load. Such operation imposes severe design constraints on the filter both in terms of power handling capacity and in avoiding any nonlinear filter effects which generate spurious harmonic energy at the output.

It should be noted that removal of the carrier in the output is the most difficult when the demanded output is the smallest, at which time, however, the ripple effects are the most noticeable, especially in audio applications. Thus, if the resulting error and the resulting distortion is measured in proportion to the output signal, a binary switching amplifier tends to produce very large percent errors when the signal being amplified becomes small.

It is desirable to design an amplifier which, while taking advantage of the benefits obtained when using switching amplifying techniques as opposed to using analog amplifying techniques, also overcomes the above problems which arise when using a binary switching amplifier system.

BRIEF SUMMARY OF THE INVENTION

In accordance with the invention, a switching amplifier is designed to utilize more output switching states than the two-state switching operation utilized in current binary switching amplifier systems. In one embodiment of the invention, a ternary, or tri-state, switching operation is utilized to provide three switching states, namely, positive power and negative power states, as used in a binary operation, and a third, or zero, power state. In the third state, a switching circuit operates as a short circuit to current and provides effective amplifier damping. The timing used in implementing the three state operation is uniquely arranged so that the critical time phasing thereof prevents major errors from adversely affecting such operation. The use of ternary switching automatically provides the desired carrier suppression and tends to minimize the ripple both for small input signals and for maximum input signals.

In a further embodiment of the invention, a quaternary, or four-state, switching operation is utilized in which, in addition to the three modes of operation in the ternary switching design, a fourth state is used to reduce distortion effects which may occur at very small input signal levels below a selected threshold. In accordance with such embodiment, the fourth operating state utilizes a linear amplifier which responds directly to the sampled input signal so that any distortion at such low input levels, which distortion might occur in a ternary switching operation, are essentially eliminated and a reproduction and amplification of very small input signals can be achieved to equal that achieved by any known analog amplification system, i.e., there is in effect no ripple signal present in the linear amplifier output. At the same time the problems which arise in analog amplifier systems at higher input signal levels are avoided. For signals above a selected threshold level, for example, the advantages of a ternary switching operation, as discussed above, are available in the quaternary system.

DESCRIPTION OF THE INVENTION

The invention can be described in more detail with the help of the accompanying drawings wherein FIG. 1 shows a block diagram of an exemplary embodiment of a known binary switching amplifier;

FIGS. 5 and 5A show exemplary graphical representations of ideal and practically realizable waveforms of a typical output signal obtained in an embodiment of the invention;

FIGS. 6 and 6A show exemplary graphical representations of typical command and output signal waveforms at low input signal levels;

FIG. 8 shows a chart of the switching states of the switches for various operating modes of the embodiment of the invention depicted in FIG. 7.

Figure 1:
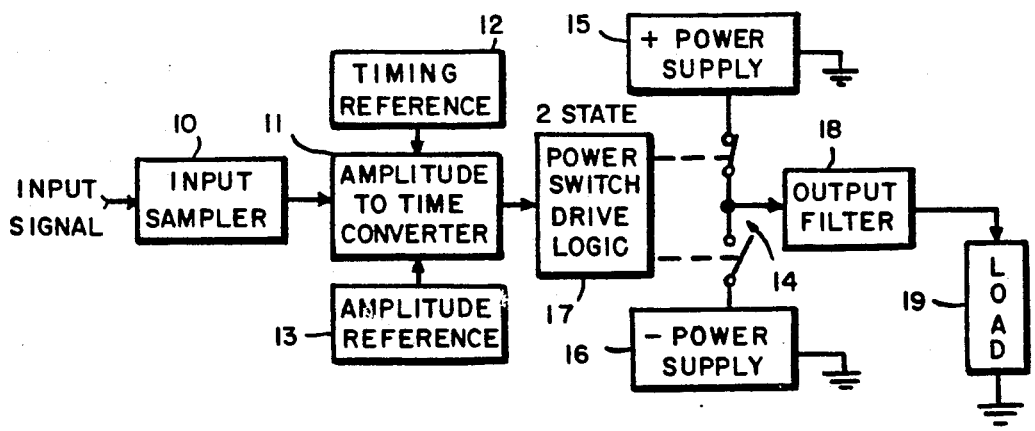
Figure 2:
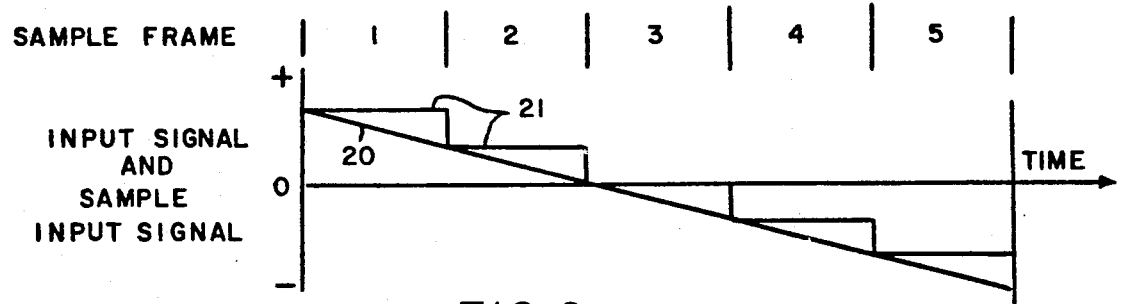
FIG. 2, 2A, 2B and 2C show exemplary graphical representations of signal waveforms present in the operation of the embodiment of FIG. 1.
Figure 2A:
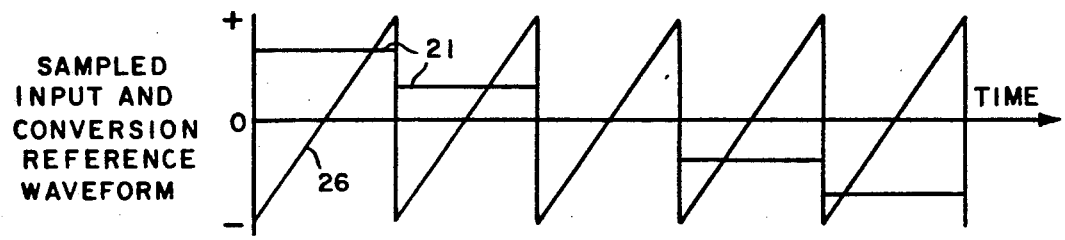
Figure 2B:
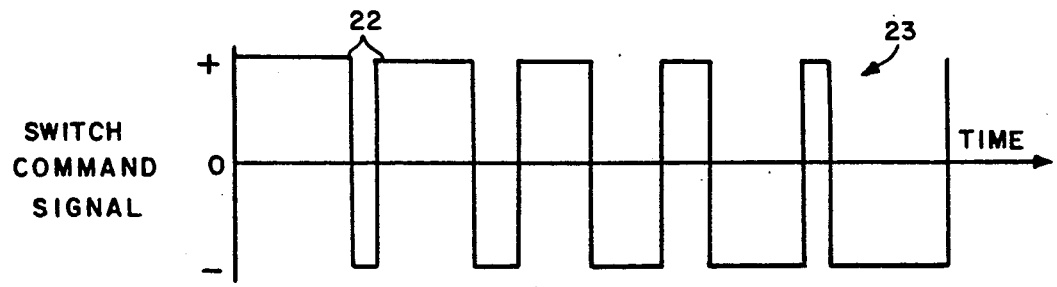
Figure 2C:
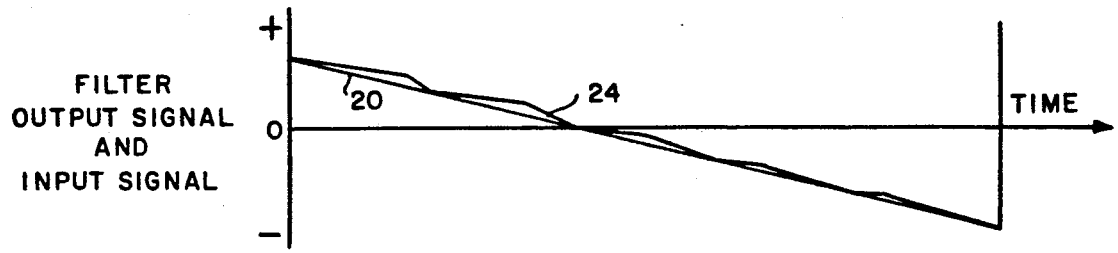
Figure 4:
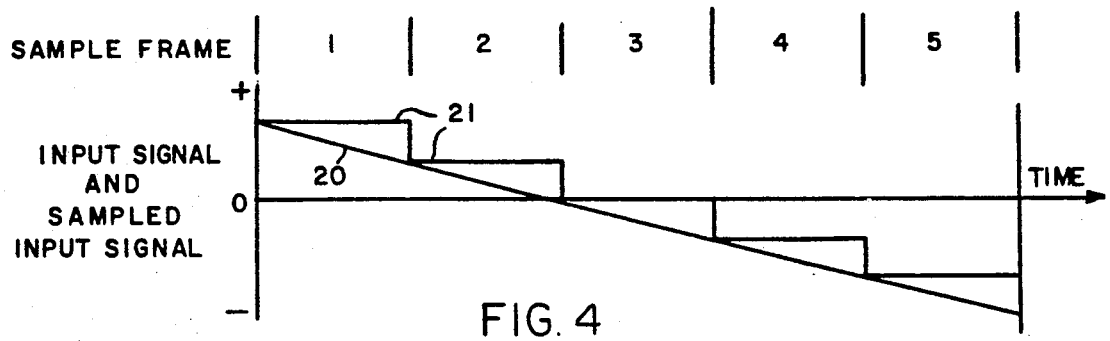
FIGS. 4, 4A, 4B and 4C show exemplary graphical representations of signal waveforms present in the operation of the embodiment of FIG. 3.
Figure 4A:
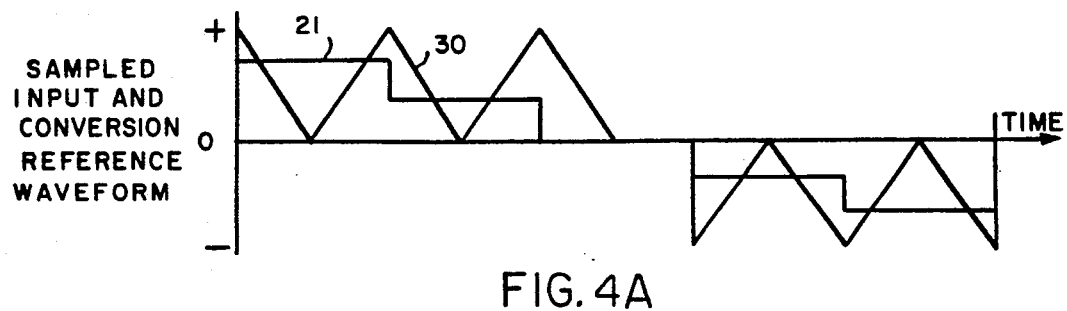
Figure 4B:
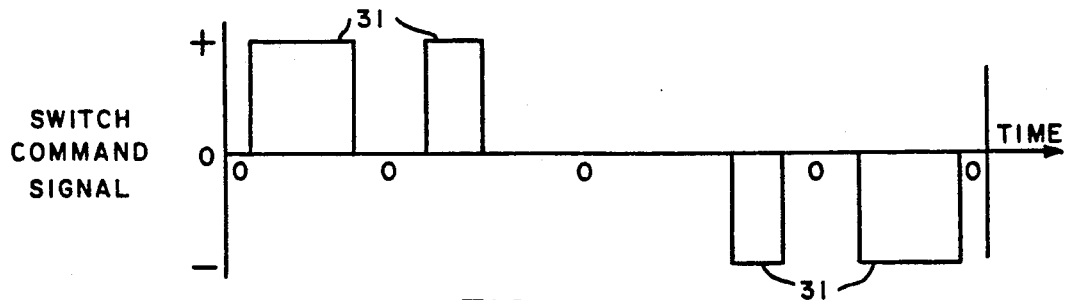
Figure 4C:
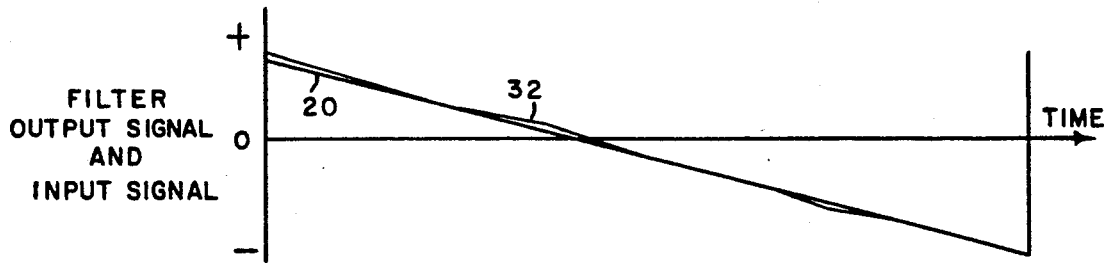
Figure 9:
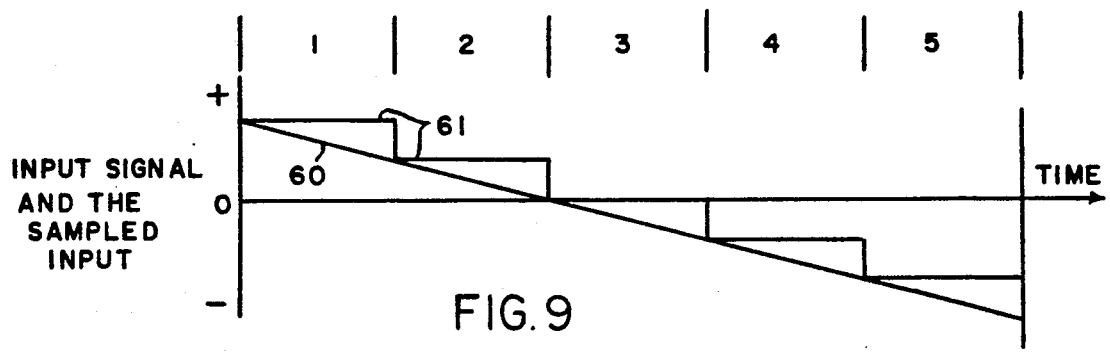
FIGS. 9, 9A, 9B and 9C show exemplary graphical representations of signal waveforms present in the operation of the embodiment of FIG. 7.
Figure 9A:
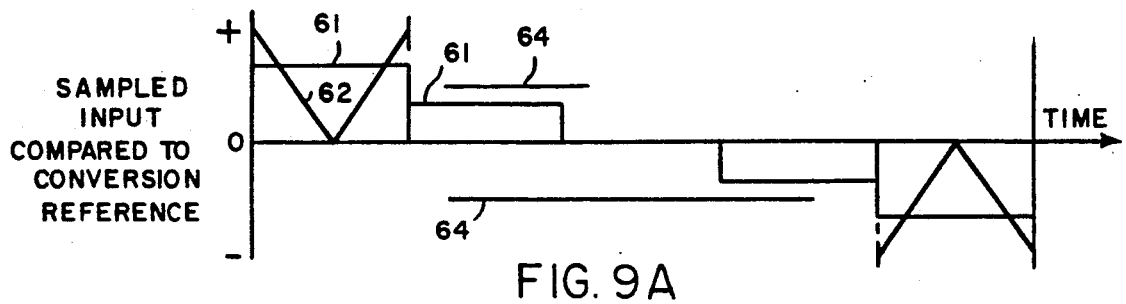
Figure 9B:
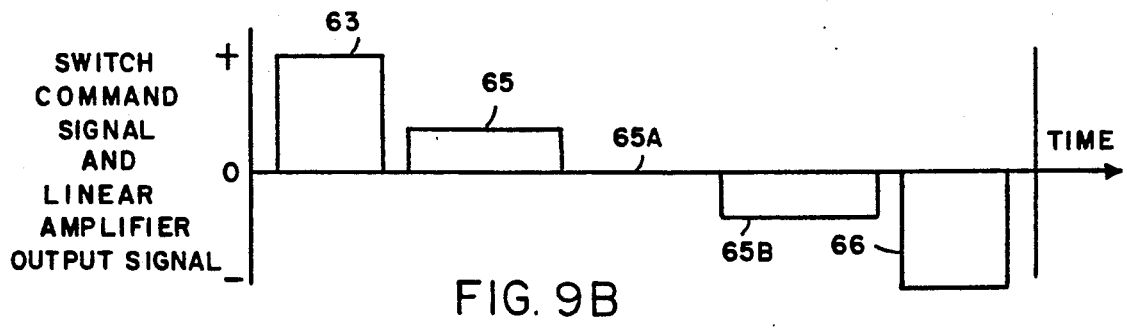
Figure 9C:
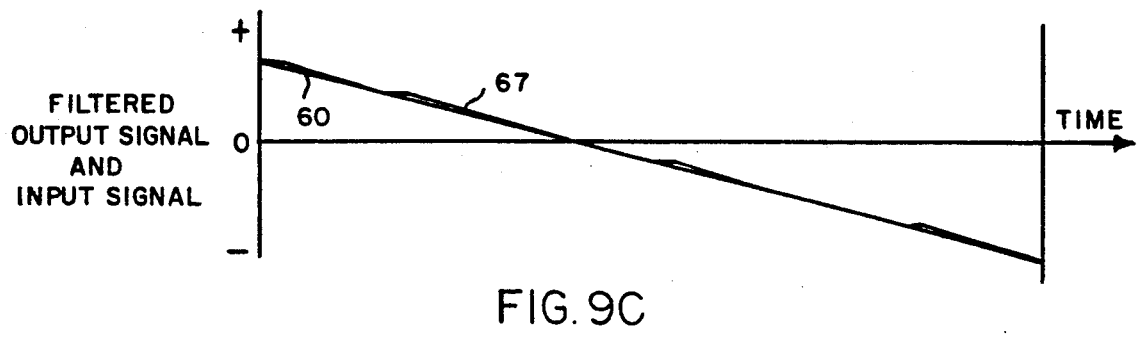

In order to understand the invention, particularly when compared with currently available binary switching amplifiers, it is helpful to discuss briefly the structure and operation of known binary switching systems, with reference to FIGS. 1 and 2.

As shown in FIG. 1, a binary switching amplifier includes an input sampling circuit 10 for digitally sampling an analog input signal which is supplied to an amplitude-to-time converter circuit 11 for converting the sampled signal into a time modulated form. A sampled signal is used to prevent any noise from adversely affecting the subsequent conversion process. Signals that are varying too quickly may also cause a problem which the sampling process avoids. Alternatively, if the input signal varies very slowly and has very little noise associated with it, the sample circuit may in such cases be eliminated.

The conversion of the sampled signal is performed using appropriate timing reference and amplitude reference signals from circuits 12 and 13, respectively, the overall sample and conversion process converting an analog input signal into a digital signal at the output of converter circuit 11, the net state-time integral of which is proportional to the input signal amplitude.

The resulting digital signal, which normally changes for each successive frame sample of the input signal, is used via a two-state power switch drive logic circuit 17 to control the state of selecting switch circuit 14 that selects either positive or negative power from positive and negative power supplies 15 and 16, respectively. A commonly used bipolar switch implementation is shown in FIG. 1 which uses relatively simple drive logic and two power supplies, as would be well known to those in the art.

The selected power supply output is applied to a load 19 through an output filter 18. The output filter averages the output amplitude/time excursions thereby providing at the load a signal that is a close replica of the input signal but which has the added power supplied by the power supplies, i.e., a power amplified version thereof.

FIGS. 2, 2A, 2B and 2C show a simplified presentation of a portion (e.g., five sample frames) of an input signal at various stages in the binary switching amplifier circuitry of FIG. 1. For the example shown, an amplitude-to-time converter uses a reference ramp signal 26 (FIG. 2A) at each frame sample to convert the sampled input signal 21 into variable width pulses 22 (FIG. 2B) which change on each successful sample for the five sample frames depicted. The ramp signal can be generated in any convenient manner, e.g., with an internally generated waveform signal circuit, the ramp being repeated for each new sample or by integrating the power switch output, as would be well known to those in the art. When the reference ramp amplitude matches that of the sampled input signal, the output state is reversed and the opposite power supply polarity is selected for the remainder of the sample period. Such operation results in a switching output signal 23 (FIG. 2B), the net area of which (i.e., the amplitude/time product) is proportional to the amplitude of the sampled input signal. When such switching output signal is filtered, the resulting output signal 24 (FIG. 2C) substantially replicates the input signal with the presence of ripple from the filtering process, as shown by filtered output signal 24.

Figure 3:
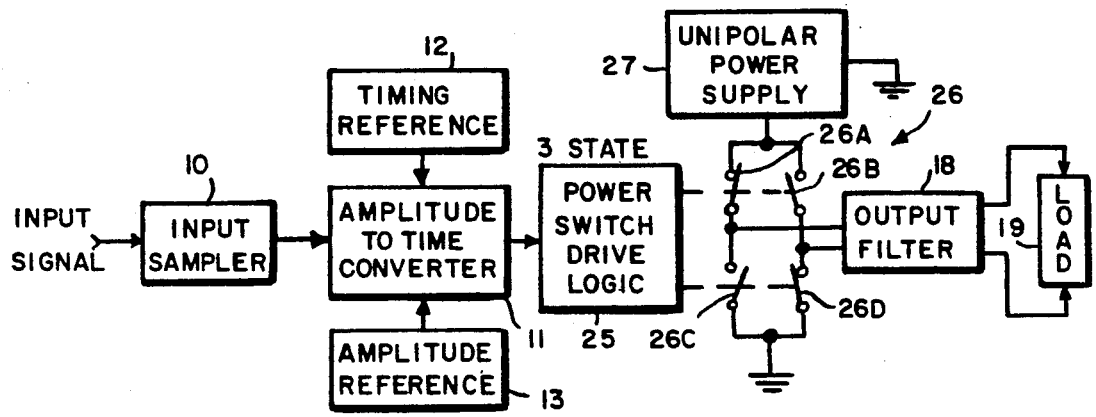
FIG. 3 shows a block diagram of an exemplary embodiment of the invention.

In order to avoid or reduce the problems which arise in using such a binary, or two-state, switching operation, the invention uses, in one embodiment thereof, a tri-state, or ternary, switching operation as shown with reference to FIG. 3. Circuits 10-13 of the type shown in FIG. 1 are used except, as described in more detail below, the timing and amplitude reference circuits operate in a different manner to provide a control signal to a 3-state power switch drive logic control circuit 25 and a different switching arrangement 26 is used. In the latter configuration, a single unipolar power supply 27 is used with switches 26A, 26B, 26C, 26D to supply a switched output signal to filter 18 and thence to a load 19.

In order to provide positive power, switches 26A and 26D are closed, in order to provide negative power switches 26B and 26C are closed, and in order to provide a third, or zero, state, either switches 26A and 26B are closed or switches 26C and 26D are closed. Such latter operations provide a short circuit path to any energy that is present on the load or in the filter.

FIGS. 4, 4A, 4B and 4C show various stages of a portion of the input signal 20 in a manner similar to that depicted for the binary switching system in FIG. 2. In the system of FIG. 3, a reference triangle-shaped signal 30 is used to convert the sampled input signal 21 into variable width pulses 31 which are changed on each successive sample. The triangle can be generated either with an internally generated waveform that is repeated for each new sample or by using a suitable integrating technique, as would be well known to those in the art.

When the magnitude of the reference triangle is greater than the magnitude of the sampled input, the output switch is commanded to the zero state. When the magnitude of the reference triangle is less than the magnitude of the sampled input, the switch is commanded to connect the unipolar supply to the load with the same polarity as the sampled input signal. This results in a signal whose net area (i.e., the amplitude-time product) is proportional to the sampled input. When filtered, the resultant filtered input signal 32 substantially replicates the input signal, with greater power, and with the presence of a ripple, as shown by filtered output signal 32.

It should be noted that the conversion process described above results in a pulse at the switch output that is centered within each frame sample and is roughly symmetrical about the midpoint of the frame since the triangle-shaped reference signal 30 is arranged to be symmetrically disposed within each time frame. Such pulses differ from the pulses created in a binary system and avoid producing a major error as would occur if the conversion were done using a triangle-shaped reference signal that is not symmetrical or by using a linear ramp starting at the beginning of the sample period, as in the binary case. If such a non-symmetric or ramp reference is used, the resulting pulse, although having three states, would not be centered within the sample frame. If the non-centered signal is then filtered, a large transient in the the filtered output would appear whenever the converted input passes through zero. By using a conversion process that is "frame centered" such error is removed and distortion of the filtered output is avoided.

The error effect discussed above can also be described in terms of modulation theory. The ternary system as described is ideally a suppressed carrier system. If the conversion is not frame centered, the output contains a residual carrier as the signal approaches zero (i.e., the carrier is not fully suppressed). When the output inverts, i.e., as the input crosses zero, both the signal and the residual carrier are inverted. The step change in carrier phase at this point injects a signal into the output filter that is equivalent to a DC step in the input signal. This causes the output filter to ring and this error signal is superimposed on the desired output. By frame centering the pulses, the filter output ringing effect is substantially reduced or effectively eliminated. Thus, the output filter ringing problem is avoided and no carrier error signal is superimposed on the desired filter output.

The ternary system of the invention also provides damping of the filter output signal by assuring that a low source impedance is always present at the input to the filter. Thus, when switch command pulse signals are present, as shown by pulses 31, for example, in FIG. 4B, the source impedance is the low impedance of the power supply 27 and damping is provided. When no switch command pulse signal is present, the switches are in the third, or zero, state, as mentioned above, in which state either switches 26A and 26B are closed or switches 26C and 26D are closed. In such case the source impedance at the filter input is effectively zero (the filter input is effectively shorted) and damping is also provided. Thus, in accordance with the operation of the system of the invention, damping of the filter output signal is always provided, as desired.

The use of a ternary switching operation that can implement three states and provide damping in the output eliminates problems inherent in a binary switching implementation. Moreover, efficiency and carrier related problems are also essentially eliminated.

Because of the use of a third state, i.e., a zero output state, the output circuitry dissipates power only in proportion to the output signal supplied by the converter. Thus, for small signal inputs, the power loss is small. For a zero state signal, the switch is always off so that no losses occur. This operation allows signficantly smaller switch circuitry yielding lower cost and higher possible switching speeds because of the lower distributed reactances in the switch circuitry itself. The reduction in power loss reduces heat generation and allows heat removal using conductive heat sinks to the amplifier package or in some cases to the wiring interconnections alone.

Since the speed performance of the switch can now be improved, the carrier frequency (or the rate of the conversion process) can be raised. This means a reduction in sampling rate induced errors because the frequency of the input response can be raised. At the same time, the filter can be made smaller because less reactance is necessary at the higher carrier frequency to obtain the same carrier rejection.

Even if the carrier frequency is not raised, the net ripple in the output signal is much lower than in the output signal of a binary system because the carrier has been essentially suppressed before the signal is even applied to the output filter.

The ripple properties of the suppressed carrier system are such that the ripple is minimized at the two extremes of pulse width output, i.e., for minimum, or near minimum, and maximum, or near maximum, signals. The minimum pulse width case is for small signal outputs where the ripple magnitude is the most damaging to the signal performance.

The maximum ripple for the ternary system occurs for the signals that are about one half the output range in either polarity. At this point the signal waveform from the switch structure to the output filter appears as a square wave. Its height, however, is one half that of the binary output for the same area. Since the voltage excursion has been reduced by two, the resulting ripple magnitude is much smaller than that for the binary system at that level.

Further, the errors and losses in the filter are greatly reduced for smaller outputs because the filter no longer has to handle the large power dissipation required to achieve peak power. The filter can now be designed on the basis of average rather than peak power requirements. As a result, it can be made smaller and for lower cost for the same ripple rejection.

The achievement of such low ripple also has implications in the overall design of the amplifier. Most switching amplifier designs often require feedback (not shown) around the overall amplifying chain, as is well known to those in the art. The feedback is used to improve the overall frequency response of the system and to reduce nonlinearity induced errors caused in the conversion process. The magnitude of the ripple in the amplifier output tends to limit the amount of signal that can be fed back to the input of the amplifier. If the ripple is relatively large, for example, the resulting signal can limit the dynamic range of the input stages in the amplifier, thus limiting the amount of gain available to reduce errors. Because the ternary system carrier is suppressed and the filter at the output can be made more effective, the amount of feedback gain can be raised, thus allowing greater error reduction in the overall amplifier.

The ternary switching amplifier described above provides significant advantages over the use of binary switching amplifiers, as well as analog amplifiers, and can find extensive use in many applications. However, there tends to be a possibility of some signal performance degradation for very small input signals, because of the finite rise and fall times of the signals at the output of the switching circuit.

The output waveforms prior to the filtering operation ideally are rectangular pulses of substantially constant height, with only the time, i.e., the widths thereof, changing as the signal varies. In a practical system, however, the state transition times make the signal waveform more nearly resemble a trapezoid shape, the leading and trailing slopes thereof being determined by the switching speeds of the switch elements involved.

Both ideal and practically realizable waveforms at the switch output, i.e., the filter input, are shown in FIGS. 5 and 5A, respectively, as exemplary waveforms 40 and 41, for an arbitrary input signal, the rise and fall times being exaggerated in the figures. If the signal is very small, any changes in the transition times can cause relatively large changes in the area of the switch output waveform. This effect can be thought of as an apparent change in the gain slope of the amplifier, particularly when the very small signal changes its magnitude. This effect represents a form of nonlinearity which causes signal distortion.

A ternary switch amplifier may also produce an additional error that is related to the non-zero transition times of the output switch. If the commanded pulse width 42 for a small input signal 43 results in a time that approaches the total rise and fall time of the switch elements (FIG. 6), the output pulse can become triangular or may not appear at all (FIG. 6A), which figures again exaggerate the rise and fall times. As the input signal 43 grows smaller and, hence, the command pulse width 42 grows narrower, an actual or practically obtainable pulse output 43 changes its characteristics accordingly as shown. Thus, there is a minimum signal level at which the area of the output is a fixed incrementally linear function of the commanded pulse width. Below this minimum level, the output area is still a function of pulse width but, since the height of the pulse is no longer constant, the change in area for a given time increment (i.e., the incremental gain) is now different.

Such a gain error for small signals is in many respects analogous to errors which arise in a Class B linear analog amplifier. The distortion created in the output is the result of the change in gain as the output structure swings through signals near zero.

For input signals that are extremely small, the switch may not be able to respond at all and no pulse will appear. This effect can occur in all switching amplifiers since time is the output modulator. Any signal that is equivalent to a time that is less than the system response capabilities cannot be reproduced.

In present binary switching implementations, these types of errors are reduced by using large feedback gain. However, because of the ripple problems with binary systems, as discussed above, the gain available is limited, due to the relatively high ripple, before such errors are induced. In a ternary system, a higher gain can be used because the ripple is lower. In neither case, however, can such feedback significantly improve the performance for signals that are below the time thresholds of the amplifiers since no signal is available for feedback.

In many applications the input signal is predominantly small, with only occasional excursions into large signal regions. One example is an analog input audio amplifier where the average signal is small but in which sufficient "headroom", i.e., amplifier response to such larger signals, is required to reproduce the occasional transients involved, as in music, for example. Another example is an amplifier used in null servo systems where amplifying large signals is required only at turn on or for slewing the servo, while for most of the time, the system normally operates near a null or very low signal. Most motor servos, or other electromechanical position servos and speed control systems, fall into this category. Except for the penalties related to power efficiency for large signals, an analog linear amplifier is often used for applications with such small analog inputs.

In accordance with another embodiment of the invention, the advantages achieved by a ternary switching operation, as well as the advantages of using an analog linear amplifier, can be obtained by utilizing a quaternary, or four-state, switching operation, particularly where small input signals predominate.

In a quaternary switching amplifier a fourth state is implemented in the output switch structure, in which state all switches are disconnected from the output filter and the load. At the same time, a linear analog amplifier, of a type which can be tailored to small signal requirements, is connected to the filter and load. Four output states can now be requested by the drive logic of the system, namely, the three states of the ternary switching amplifier plus a fourth state in which another form of amplifier, typically analog, is used.

The fourth state is selected on the basis of a particular performance criteria. In the case of music, or any application in which small signals are predominant, for example, such criteria would involve the input signal magnitude. Thus, below a certain input signal magnitude the fourth state is selected, while above such magnitude, the output operation uses a ternary switching operation. For this case, an amplitude "window" detection approach can be used. If the input signal is within the window, the system operates as an analog amplifier. Whenever the input is outside the window, the amplifier operates as a ternary switching system.

The analog amplifier used while in the fourth state can be specifically tailored to achieve the highest performance for small signals as a Class A, Class B, or whatever type is necessary to meet overall signal performance needs. The penalty imposed on a linear analog amplifier used to achieve this improved signal performance is in its power inefficiency as discussed above. This inefficiency, however, is now bounded by a much lower maximum signal level requirement. Thus, the net power losses involved can be made very small relative to the maximum power handling capabilities of the ternary switching amplifier operation at higher input signals magnitudes.

By suitably selecting the performance criteria used, the overall efficiency of the amplifier can still be much higher than that of binary switching amplifier. At the same time the errors associated with the transition time effects in switching amplifiers are greatly reduced and minimum signal level related errors are avoided. Further, more feedback gain can be used since no switching ripple is present in the system when it is operating in the fourth state.

Figure 7:
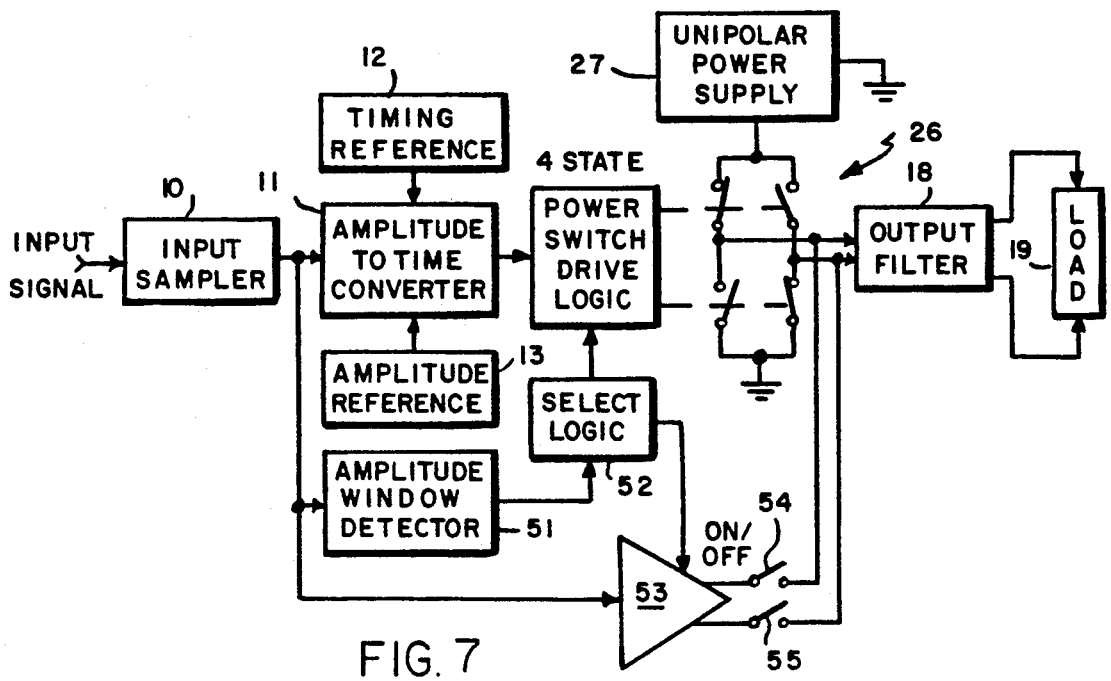
FIG. 7 shows a block diagram of another exemplary embodiment of the invention.

A quaternary switching amplifier in accordance with the invention is shown in FIG. 7. As can be seen therein, the complete circuitry of a ternary amplifier is retained and the signal is processed thereby in the same manner. An amplitude window detector 51, decision making select logic 52, and a separate linear amplifier 53 and switches 54 and 55 associated therewith for turning the output thereof on and off, are also used. Further, the output switch device drive logic circuit is modified to provide a capability of turning all the switches to their off state so as to implement the fourth state.

The output switch states are shown in FIG. 8. In many cases it is possible to implement the two switches 54 and 55, shown at the output of the linear amplifier 53, without the need to use active switch elements as shown. For example, the linear amplifier can be modified to include suitably connected diodes in its output circuit, as would be well known to the art, the amplifier output being turned on and off by low level internal switches that back-bias the output diodes when the linear amplifier is not being used.

It should be noted that in the switching circuit shown in FIG. 7, other types of amplifiers could be substituted for linear amplifier 53, although the specific implementation shown in the figure effectively addresses an important application wherein relatively small signals are present, as found in audio systems and in null servo systems, for example.

The output of the switch circuitry in FIG. 7 is applied to an output filter 18 and then to a load 19. The requirements for the output filter are further simplified from that used in a ternary switching system. Since the low level signals from the amplifier no longer have any switching transients to produce a ripple, the errors produced by the filter operation do not appear when using the fourth state. Moreover, when the output is switching, as for large input signals, the ripple that is present for large signals appears as a much smaller error relative to the outputs being generated.

FIGS. 9, 9A, 9B and 9C show a simplified presentation of the signals at various stages in the quaternary switching amplifier. For the example depicted, the use of a sampling circuit is shown in the amplifier as a comparison to the ternary case. In many cases, as discussed above, such a sampling circuit may not be needed.

As in the ternary case, the input signal 60 can be sampled and the sampled signal 61 held for the conversion process which follows. The sample signal 61 is then compared to an internal reference triangular waveform 62 just as in the ternary case. This process and its resulting switch command output 63 (FIG. 9B) is shown in the first sample frame in the figures. At the end of the first frame, in the example shown, the input signal is less than the window amplitude level limits 64 (FIG. 9A) being used by the amplitude window detector 51 and remains within the window limits during the next three frames (frames 2, 3 and 4). As a result the select logic 52 now commands the switches to be in the fourth state mode so as select the output of the linear amplifier during the next three frames. Thus, the outputs 65, 65A, and 65B during such frames are the outputs from the linear amplifier 53. In the frame (frame 5) following such three frames, however, the detector detects a sampled signal that is again bigger than, i.e., outside, the window limits. The select logic 52 then arranges the output to return to the ternary mode so that the output again becomes the pulse width modulated signal 66 (FIG. 9B) from the ternary switching portion of the amplifier system.

The composite output is applied to the output filter and the load, as in the ternary case. The resulting output signal 67 (FIG. 9C) is then a substantial replica of the input signal with a superimposed ripple component.

When operating in the ternary mode for large signals (greater then the "window" at the detector 51), the quaternary amplifier has all the properties of a ternary amplifier including its high efficiency and damping operation, as discussed above. When in the fourth state, for small input signals (within the window), the quaternary amplifier has all the properties of the linear amplifier (or whatever type of amplifier is used), including low distortion and error and further including the desired damping since the linear amplifier also presents a low impedance to the input of filter 18 as required for such damping.

Any inefficiency penalty imposed by the addition of the linear amplifier can be made relatively small. If the switch over to the fourth state is done for signal amplitudes that are a selected fraction of the total amplitude signal range, for example ¼, the amplifier used in the fourth state need only handle 1/16th of the total power at the maximum amplitude. The power inefficiencies in the fourth state are thus related to a level that is 1/16 of the maximum power, rather than to the full power amount which would be involved when using only a pure linear amplifier over the entire range. The total power penalty imposed is therefore relatively small and allows the use of a relatively small and inexpensive linear amplifier.

Another advantage of the quaternary switching amplifier involves the use of the sampling circuit at the input thereto. One of the reasons a sampling circuit is used is to prevent false analog to digital conversions near zero inputs that could result if the signal were slewing or had significant noise. Since conversion is no longer being performed near zero input signal levels (i.e., in the fourth state), it is possible to eliminate the sampling circuit in many cases. Such elimination results in significant performance benefits since it not only removes another source of error in the signal path but it also allows an increase in the bandwidth of the overall amplifier, thereby permitting the use of a wider feedback bandwidth for reducing any non-linearities in the conversion process.

In order to provide the most effective operation of such a quaternary switching-amplifier, it is desirable that certain characteristics of the ternary switching-amplifier and of the linear amplifier be matched. Thus, the designs thereof should be such that the transient responses, the frequency responses, the gains, the D.C. biases, and the source impedances of such amplifiers are matched as effectively as possible. Design of the circuitries thereof so as to provide the required characteristics for each in order to produce such effective matching would be well within the skill of those in the art and need not be described in further detail here.

It is understood that the specific embodiments described above represent exemplary embodiments of the invention and that modifications thereto may occur to those in the art without departing from the spirit and scope of the invention. Hence, the invention is not to be construed as limited to the particular embodiments disclosed herein except as defined by the appended claims.

What is claimed is:

1. An amplifier system comprising
   a switching power amplifier including
      means responsive to an input signal for providing a tri-state command signal having discrete amplitudes as a function of time, which amplitudes represent a positive state, a negative state, or a zero state;
      power supply means capable of supplying a power output signal having a specified polarity;
      switching means connected to said power supply means and responsive to said tri-state command signals for providing a power output signal having discrete amplitude levels, time durations and polarities in response to tri-state command signals representing positive and negative states and for providing a short circuited output at a specified voltage potential in response to a tri-state command signal representing a zero state; and
      filter means responsive to said power output signal for providing a filtered power output signal to a load, said filtered power output signal being a substantial replica of said input signal.

2. An amplifier system in accordance with claim 1 wherein said input signal responsive means includes
   amplitude to time conversion means responsive to a time reference signal and to an amplitude reference signal, for providing said tri-state command signal; and said switching means includes
      a plurality of switches connected to said power supply means; and
      switch drive logic means responsive to said tri-state command signal for activating selected ones of said switches to provide said power output signals.

3. An amplifier system in accordance with claim 2 wherein said input signal is an analog input signal and further including
   signal sampling means responsive to said analog input signal for providing timed samples of said input signal, each sample having a discrete amplitude level dependent on the analog amplitude of said input signal at the sample time and for supplying said timed samples of said input signal to said amplitude to time conversion means.

4. An amplifier system in accordance with claim 3 wherein said amplitude reference signal has a triangular waveshape for providing said tri-state command signal.

5. An amplifier system in accordance with claim 4 wherein said timed samples of said input signal occur at selected successive time frames, the discrete amplitudes of said tri-state command signal having selected time durations occurring in each time frame and being centered in said time frames.

6. An amplifier system in accordance with claim 5 wherein said triangular reference signal is arranged to be symmetrically disposed within said timed frames so as to center the discrete amplitudes of said tri-state command signal in said time frames.

7. An amplifier system in accordance with claim 5 wherein said power output signal is provided to said filter means from a source of low impedance to provide damping of the filtered power output signal from said filter means.

8. An amplifier system in accordance with claim 1 wherein said specified polarity is a positive polarity.

9. An amplifier system in accordance with claim 1 wherein said specified polarity is a negative polarity.

10. An amplifier system comprising a switching power amplifier including
    means responsive to an input signal for providing a tri-state command signal having discrete amplitudes as a function of time, which amplitudes represent a positive state, a negative state, or a zero state;
    power supply means capable of supplying a power output signal having a specified polarity;
    switching means connected to said power supply means and responsive to said tri-state command signal for providing a power output signal having discrete amplitude levels, the time durations and polarities of which correspond to the state of said tri-state command signal;
    filter means responsive to said power output signal for providing a filtered power output signal to a load, said filtered power output signal being a substantial replica of said input signal;
    means for detecting the amplitude of said input signal; and
    means for providing a fourth state command signal when the amplitude of said input signal is below a selected level and for providing said tri-state command signal only when the amplitude of said input signal is above said selected level.

11. An amplifier system in accordance with claim 10 wherein said fourth state command signal activates a further amplifier means for providing an amplified input signal to said filter means when said input signal is below said selected level.

12. An amplifier system in accordance with claim 11 wherein said further amplifier means is a linear amplifier.

13. An amplifier system in accordance with claim 11 wherein selected characteristics of said further amplifier means are matched to selected characteristics of said switching power amplifier.

14. An amplifier system in accordance with claim 13 wherein said selected characteristics include the transient responses, the frequency responses, the gains, the D.C. biases, and the source impedances of said further amplifier means and said switching power amplifier.

15. A switching power amplifier in accordance with claim 11 wherein said further amplifier means includes further switching elements for turning said linear amplifier on and off, said fourth state command signal activating said further switching elements to turn on said linear amplifier and to disconnect said tri-state switching means from said filter means when the input signal is below said selected level.

16. An amplifier system in accordance with claim 10 wherein said specified polarity is a positive polarity.

17. An amplifier system in accordance with claim 10 wherein said specified polarity is a negative polarity.

* * * * *